United States Patent [19]

Fincher et al.

[11] Patent Number: 5,847,557
[45] Date of Patent: Dec. 8, 1998

[54] WIRE PAIR IDENTIFICATION METHOD

[76] Inventors: William C. Fincher; Randall W. Fincher, both of 254 Field End Rd., Sarasota, Fla. 34240

[21] Appl. No.: 870,217

[22] Filed: Jun. 6, 1997

Related U.S. Application Data

[60] Provisional application No. 60/026,186, Sep. 19, 1996.

[51] Int. Cl.[6] ................................................. G01R 19/145
[52] U.S. Cl. ........................... 324/66; 324/508; 324/556; 324/133; 379/25; 340/825.49
[58] Field of Search ...................... 324/508, 509, 324/527, 528, 556, 66, 67, 133; 379/21, 22, 25, 26, 27; 340/825.36, 825.49

[56] References Cited

U.S. PATENT DOCUMENTS

| | | | |
|---|---|---|---|
| 3,902,026 | 8/1975 | Rogers et al. | 379/25 |
| 3,922,507 | 11/1975 | White | 379/27 |
| 4,074,187 | 2/1978 | Miller et al. | 324/66 |
| 4,121,152 | 10/1978 | Hale et al. | 324/66 |
| 4,445,086 | 4/1984 | Bulatao | 324/66 |
| 4,564,728 | 1/1986 | Romano | 379/27 |
| 4,575,588 | 3/1986 | Vyver | 379/22 |
| 4,578,636 | 3/1986 | Bakke et al. | 324/66 |
| 4,596,904 | 6/1986 | Messenger | 379/22 |
| 4,620,070 | 10/1986 | Ruehl | 379/27 |
| 4,626,633 | 12/1986 | Ruehl et al. | 379/27 |
| 5,185,570 | 2/1993 | Fitzpatrick | 324/556 |

Primary Examiner—Diep N. Do
Attorney, Agent, or Firm—John A. Thomas

[57] ABSTRACT

An apparatus and method of identifying wires or circuits uses plugs with light-emitting diodes ("LED's") attached across the plug contacts corresponding to the wiring circuit. All of the jacks in a terminal or patch panel are filled with such plugs prior to testing and are monitored by a first worker. A second worker, in two-way communication with the first worker, applies a test voltage at the remote terminations of the wires, causing the corresponding LED to light, but no others. The lit LED immediately identifies the circuit, which can be labeled, and the process repeated. When testing is complete, all plugs with LED's are removed from the terminal for re-use.

8 Claims, 2 Drawing Sheets

WIRE PAIR IDENTIFICATION METHOD

CLAIM FOR PRIORITY

This application claims the benefit of the filing date of that certain provisional patent application disclosing the same invention, titled "Wire Pair Identification Method" and filed Sep. 19, 1996 under application Ser. No. 60/026,186.

BACKGROUND

This invention relates to sorting electrical conductors, particularly to an improved method and apparatus for identifying individual wires or circuits of a plurality of wires or circuits extending between two spaced locations.

It is often necessary to identify individual wires or circuits which extend between two locations. In the communications industry, a separate pair of wires is used for each line between the distribution frame in a terminal room and the user telephone or work station. The distribution frame is typically called the "patch panel", and it may contain hundreds, or even thousands of circuits. Factories, ships and aircraft also have many individual wires carrying power and signals between different locations. Although the present invention is primarily directed toward solving a problem of the communications industry, the apparatus and method could be extended to any system wherein large numbers of wires between spaced locations must be identified. In this application, the term "wire", unless otherwise stated or shown by the context, will also refer to a complete circuit, such as the wire pairs used by telephone systems.

The most commonly used method for identifying such wires uses two workers. One worker is stationed at the patch panel, and the other worker is stationed at the remote location to be identified. Here, "identify" means to determine which of the many wires connected to the patch panel is the same wire connected to the remote location. The worker at the remote location applies a test tone to the wires there. The worker at the patch panel sequentially scans the terminations at the panel until the energized conductor is found. The correct conductor is then labeled, and the process repeated, until all wires are identified. This process can take days or even weeks in large installations.

Other methods which can rapidly return a wire identification use permanently connected or built-in devices which maintain a matrix of identified wires in random-access memory. Such devices will be expensive to manufacture, and generally are not needed in communications installations once all the wires have been identified and labeled. In any case, what is needed is a method of identifying wires which is inexpensive, fast, and simple to use.

SUMMARY

The present invention presents an improved method and apparatus for identifying wires connected between spaced locations. The method relies on the existence at each of the two locations of a jack and plug means which can be rapidly inserted and removed by hand. Such jacks are typical in communications installations, which commonly accept the industry-standard RJ-11 or RJ-45 type plugs.

A standard plug is modified by attaching a light-emitting diode ("LED") to the tip and ring wire pair in the plug. A plurality of such modified plugs is then inserted into all of the jacks in the patch panel whose wires are to be identified. Since such plugs insert and lock by simply being pushed into the jack, this can be done quickly.

One worker remains stationed at the patch panel location. The other worker applies a voltage to the plug in a remote location, which lights the corresponding LED plugged into the patch panel, and only that LED. The worker at the patch panel communicates (usually by two-way radio) this information to the worker at the remote location. Thus the correct wire for that location on the patch panel is instantly identified, and can be labeled by the remote worker. The process proceeds as fast as the remote worker can move from location to location. More than one worker can apply the test voltage to different wires at the same time, so long as all the remote workers coordinate their efforts with the worker at the patch panel. After all the wires have been identified and labeled, the worker at the patch panel can quickly remove all the LED and plug combinations for re-use on another job.

DRAWINGS

DETAILED DESCRIPTION

Figure 1:
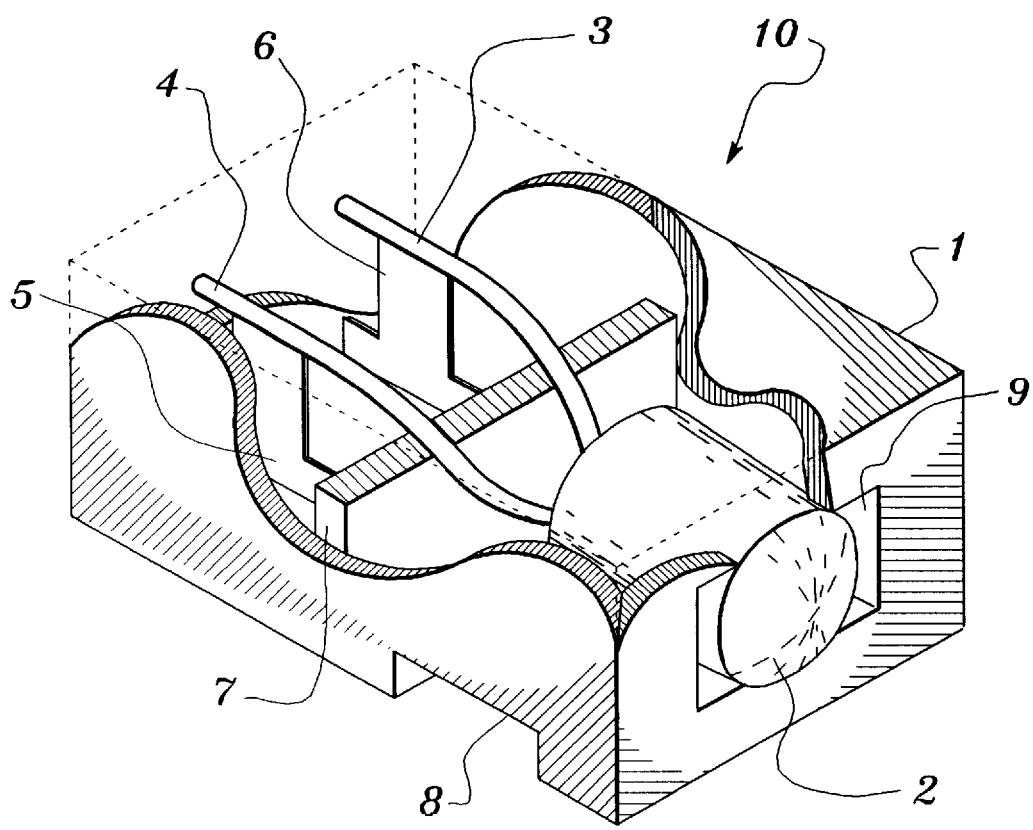
FIG. 1 shows a plug modified to accept an LED.

FIG. 1 shows an RJ-45 telephone plug 1 as used in the preferred embodiment of the invention. The plug 1 is drawn as transparent, and the retaining clip is omitted. The plug 1 has an opening 9 in its non-mating end. The mating end of the plug 1 has at least two contacts 5 and 6 which contact lines 4 and 5 in the RJ-45 telephone jack. An LED 2 is inserted into the opening 9 of the plug 1. It will be necessary to remove some of the body of the plug 1 to insert the LED. The leads 3 and 4 of the LED are placed over the contacts 5 and 6, and the plug 1 is crimped. Crimping causes the crimping member 7 of the plug 1 to engage and firmly grasp the leads 3 and 4 of the LED 2 and hold it in place. The LED will be held between the upper inside surface (not shown) of the plug 1 and the inside surface of a slot 8 which is part of the conventional RJ-45 plug 1. The combination of plug 1 and the LED 2 creates the indicator plug 10.

If the LED and plug combination is made by crimping, it will be necessary to modify the crimping tool, so that the tool will not apply excessive pressure to slot 8 where the LED 2 rests. Specially manufactured plugs containing an LED attached to the appropriate contacts may also be used instead of standard RJ-45 or RJ-11 plugs.

When the indicator plug 10 is inserted in the corresponding jack on a telephone patch panel, lines 4 and 5 contact the leads 3 and 4 of the LED 2. If the lines are energized with a voltage exceeding the forward voltage drop of the LED, and of the proper polarity, the LED 2 will light. As will be explained below, it is not important to which line the anode or cathode of the LED 2 is attached, so long as all such plugs are configured the same way.

The plug 1 may also be a conventional RJ-11 type, in which case the energized contacts will be those corresponding to lines 3 and 4, and the leads 3 and 4 of the LED 2 in the plug 1 will be connected accordingly to the contacts 5 and 6. In certain communications systems, other wire pairs, such as lines 1 and 2, may be energized. In such cases, the pins of the LED 2 will be connected across energized lines. Plugs and jacks other than the "RJ" series may be used in other types of wiring systems, so long as they are capable of being connected and disconnected relatively rapidly.

Other light sources, such as small incandescent bulbs, may be used in the indicator plug 10, but LED's have the advantages of ruggedness and long life.

Figure 2:
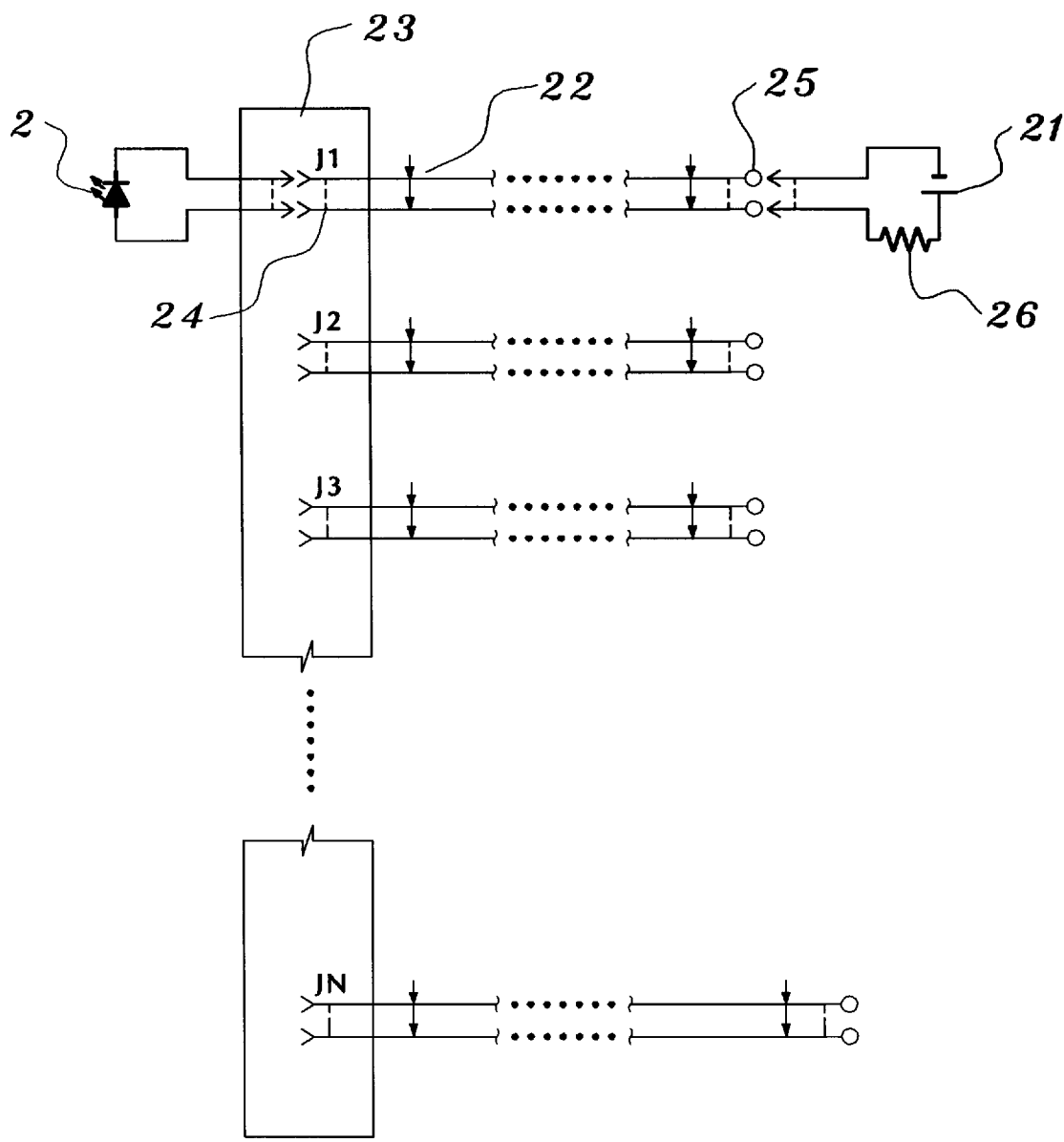
FIG. 2 shows schematically the connections between the indicator plugs in a patch panel and the remote locations.

FIG. 2 shows schematically a patch panel 23 having a plurality of jacks 24 for receiving RJ-type plugs. An LED 2 in an indicator plug 10 is shown connected electrically to a pair 22 of wires. The pair 22 extends from the patch panel 23 an indefinite distance to a outlet jack 25. The jack 25 receives a plug connected to a battery 21 or other DC voltage source. The polarity of the battery 21 is determined so that the LED 2 at the patch panel jack 24 corresponding to the pair 22 is forward biased and will light. All of the other jacks on the patch panel have indicator plugs 10. However, only the LED 2 in the corresponding indicator plug 10 will light, thereby immediately identifying the pair 22. A resistor 26 is included in the circuit if necessary to limit the current through the LED 2. Current limiting may be necessary if voltages greater than approximately 1.5 volts are used.

Circuit testing begins after a worker located near the patch panel has inserted an indicator plug 10 into each of the patch panel jacks. A second worker then applies the test voltage to each remote jack which it is desired to identify. The workers are in two-way communication, so that the worker at the remote jack can identify the jack to which he has applied the test voltage. The worker at the patch panel can immediately locate the corresponding jack there because the LED 2 in the indicator plug 10 inserted therein will light. The worker at the patch panel can then label the jack and tell the remote worker to proceed to another location for another test. Or, the labeling may be done at the remote location, thereby relating a patch panel identifier to the remote location. The process may repeat itself until all of the wires or circuits are identified. When identification is complete, the workers remove the indicator plugs 10 for re-use elsewhere. Alternatively, the indicator plugs 10 can be removed as lines are identified, which helps the worker at the patch panel determine if any lines have been missed.

The reader will see that the method described above can be used in other wiring systems than communications systems. All that is required is that the terminal containing all the wires of the system have jacks allowing relatively quick connection of plugs such as the indicator plug 10 described above. If this is the case, wires can be immediately identified by the application of a test voltage to the remote terminations of the wires, in the manner described above. Wires in factories, ships, aircraft and power plants could be identified using the above-described method.

The reader will see that the need for a method of identifying wires in a wiring system has been attained by the present invention, as described above. Since certain changes could be made in the embodiment of the invention described above without departing from the spirit and scope of the invention, we intend that all matter contained in the foregoing description and drawings shall be interpreted as illustrative and not in a limiting sense.

We claim:

1. A kit for identifying wire pairs in a wiring system having a patch panel and jack locations remote from the patch panel, the kit comprising:
    a. A plurality of indicator plugs for insertion into each of the jacks of the patch panel;
    b. a means for sequentially applying a test voltage at each remote jack location to the wire pairs connected to the patch panel; and,
    c. the jacks of the patch panel each having inserted therein an indicator plug;
whereby the applied test voltage at the remote location causes an indicator plug inserted into a particular patch panel jack to light, when the particular patch panel jack is electrically connected to the remote jack through a wire pair.

2. The kit of claim 1, where the means for applying test voltage further comprises:

a. a test plug for insertion into a jack remote from the patch panel; and,
    b. a source of DC voltage connected to the test plug.

3. The kit of claim 2 above where the source of DC voltage is a battery.

4. The kit of claim 2 above where the means for applying test voltage further comprises a current-limiting resistor connected between the source of DC voltage and the test plug.

5. The kit of claim 1 where the indicator plug comprises:
    a. a plug adapted to fit a pre-selected type of patch-panel jack, the plug having at least two connector pins;
    b. a lamp means integral with the plug;
the lamp means connected across the two connector pins of the plug connecting to the wire pair.

6. The kit of claim 5 where in the lamp means comprises a light-emitting diode.

7. A method of using a kit to identify wire pairs in a wiring system having a patch panel and jack locations remote from the patch panel; the kit comprising:
    a. A plurality of indicator plugs for insertion into each of the jacks of the patch panel;
    b. a means for sequentially applying a test voltage at each remote jack location to the wire pairs connected to the patch panel; and,
    c. the jacks of the patch panel each having inserted therein an indicator plug;
    whereby the applied test voltage at the remote location causes an indicator plug inserted into a particular patch panel jack to light, when the particular patch panel jack is electrically connected to the remote jack through a wire pair;
the method comprising the steps of:
    a. inserting one indicator plug selected from the kit into each jack of a patch panel, each jack of the patch panel being connected to a wire pair desired to be identified, so that all wire pairs desired to be identified are connected to indicator plugs at the patch panel;
    b. applying a test voltage to each remote jack, one remote jack at a time; the remote jack being connected to one of a plurality of wire pairs connected to the patch panel;
    c. recording at the patch panel location which indicator plug lights when the test voltage is applied to a particular remote jack, so as to identify the patch panel jack and the remote jack by associating them with one another;
    d. communicating the fact of a successful identification to a worker at the remote location;
    e. choosing a new remote jack to test;
    f. repeating steps "a" through "e" above until all wire pairs desired to be tested have been identified; and,
    g. removing the indicator plugs from the patch panel to be re-used.

8. A method of using a kit to identify wire pairs in a wiring system having a patch panel and jack locations remote from the patch panel; the kit comprising:
    a. A plurality of indicator plugs for insertion into each of the jacks of the patch panel;
    b. a means for sequentially applying a test voltage at each remote jack location to the wire pairs connected to the patch panel; and,
    c. the jacks of the patch panel each having inserted therein an indicator plug;
    whereby the applied test voltage at the remote location causes an indicator plug inserted into a particular patch panel jack to light, when the particular patch panel jack is electrically connected to the remote jack through a wire pair;

the method comprising the steps of:

a. inserting one indicator plug selected from the kit into each jack of a patch panel, each jack being connected to a wire pair desired to be identified, so that all wire pairs desired to be identified are connected to indicator plugs at the patch panel;

b. applying a test voltage to each remote jack, one jack at a time; the remote jack being connected to one of a plurality of wire pairs connected to the patch panel;

c. recording at the patch panel location which indicator plug lights when the test voltage is applied to a particular remote jack, so as to identify the patch panel jack and the remote jack by associating them with one another;

d. communicating the fact of a successful identification to a worker at the remote location;

e. choosing a new remote jack to test;

f. removing the indicator plug from the just-identified patch panel jack, to be re-used; and, g. repeating steps "a" through "f" above until all wire pairs desired to be tested have been identified.

* * * * *